(12) United States Patent
Geng et al.

(10) Patent No.: US 10,813,242 B2
(45) Date of Patent: Oct. 20, 2020

(54) MOUNTING AID

(71) Applicant: PATCHBOX GMBH, Vienna (AT)

(72) Inventors: Alexander Geng, Vienna (AT); Josef Hofstätter, Ennsbach (AT)

(73) Assignee: PATCHBOX GMBH, Vienna (AT)

( * ) Notice: Subject to any disclaimer, the term of this patent is extended or adjusted under 35 U.S.C. 154(b) by 0 days.

(21) Appl. No.: 16/327,633

(22) PCT Filed: Aug. 10, 2017

(86) PCT No.: PCT/AT2017/000057
§ 371 (c)(1),
(2) Date: Feb. 22, 2019

(87) PCT Pub. No.: WO2018/035546
PCT Pub. Date: Mar. 1, 2018

(65) Prior Publication Data
US 2019/0230811 A1    Jul. 25, 2019

(30) Foreign Application Priority Data

Aug. 23, 2016  (AT) ...................................... 391/2016

(51) Int. Cl.
*E04G 3/00* (2006.01)
*H05K 7/14* (2006.01)
(Continued)

(52) U.S. Cl.
CPC ............ *H05K 7/1488* (2013.01); *B25H 7/00* (2013.01); *H05K 7/16* (2013.01)

(58) Field of Classification Search
CPC ...... H05K 7/1491; H02B 1/202; G06F 1/1601
See application file for complete search history.

(56) References Cited

U.S. PATENT DOCUMENTS

| 6,392,149 B1* | 5/2002 | Kim ..................... H05K 7/1491 |
| | | 174/70 R |
| 6,856,505 B1* | 2/2005 | Venegas ................ G06F 1/1601 |
| | | 361/679.05 |

(Continued)

FOREIGN PATENT DOCUMENTS

| CN | 2575934 Y | 9/2003 |
| CN | 1835126 A | 9/2006 |

(Continued)

OTHER PUBLICATIONS

International Preliminary Report on Patentability dated Feb. 26, 2019 issued in corresponding International Patent Application No. PCT/AT2017/000057 with English translation.

(Continued)

*Primary Examiner* — Amy J. Sterling
(74) *Attorney, Agent, or Firm* — Pillsbury Winthrop Shaw Pittman, LLP

(57) ABSTRACT

Mounting aid for the mounting of rack mounts in frames, in particular racks for use in information technology, comprising at least two relatively to one another adjustable, in particular pivotable legs, wherein the legs at their free ends each comprises a fastening element that is arranged in an angled manner with respect to the leg and is designed for fastening the free ends of the legs to rails, in particular sheet metal angles, of the frame, said rails being directed to each other, projecting inwardly and being provided with a row of holes.

11 Claims, 6 Drawing Sheets

Figure 1:
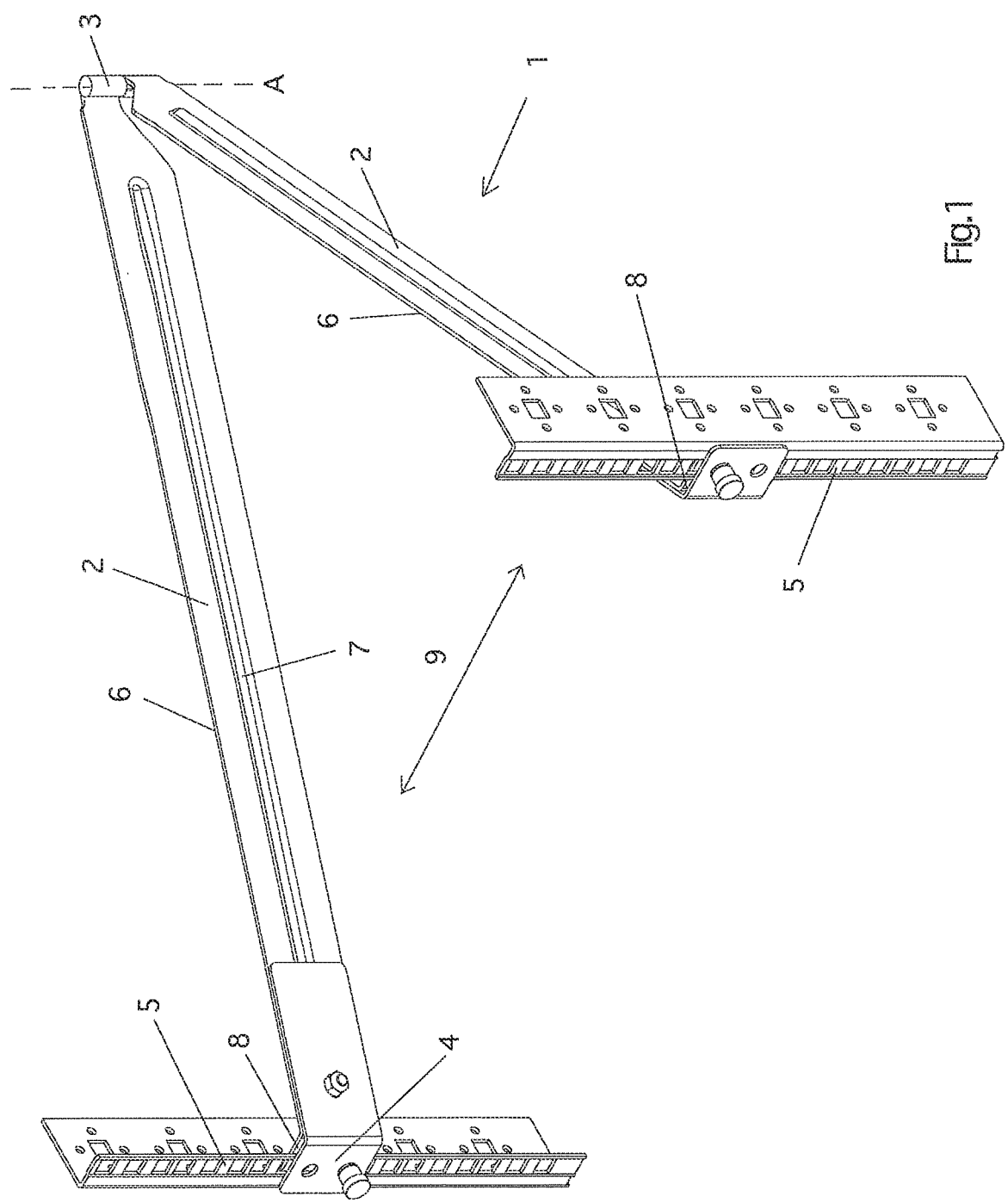

(51) Int. Cl.
*B25H 7/00* (2006.01)
*H05K 7/16* (2006.01)

(56) References Cited

U.S. PATENT DOCUMENTS

| | | | |
|---|---|---|---|
| 7,066,438 B2* | 6/2006 | Ma | F16M 11/046 |
| | | | 248/166 |
| 9,769,947 B1* | 9/2017 | Sands | H05K 7/1491 |
| 2003/0150823 A1 | 8/2003 | Dean et al. | |
| 2004/0120134 A1* | 6/2004 | Nguyen | H02B 1/202 |
| | | | 361/825 |
| 2006/0157436 A1 | 7/2006 | Iwamoto | |
| 2009/0026898 A1 | 1/2009 | McIntosh et al. | |
| 2012/0120611 A1 | 5/2012 | Ni et al. | |
| 2014/0048496 A1 | 2/2014 | Chen et al. | |
| 2015/0282377 A1 | 10/2015 | Hilburn et al. | |

FOREIGN PATENT DOCUMENTS

| | | |
|---|---|---|
| CN | 101346049 A | 1/2009 |
| CN | 201854530 U | 6/2011 |
| CN | 205148270 U | 4/2016 |
| DE | 202012005068 U1 | 8/2012 |
| WO | 2010/094460 A1 | 8/2010 |

OTHER PUBLICATIONS

International Search Report dated Oct. 19, 2017 issued in corresponding International Patent Application No. PCT/AT2017/000057 w/English translation.

Office Action dated Mar. 23, 2020 issued in corresponding Chinese Patent Application No. 201780051766.4 with English translation (10 pgs.).

* cited by examiner

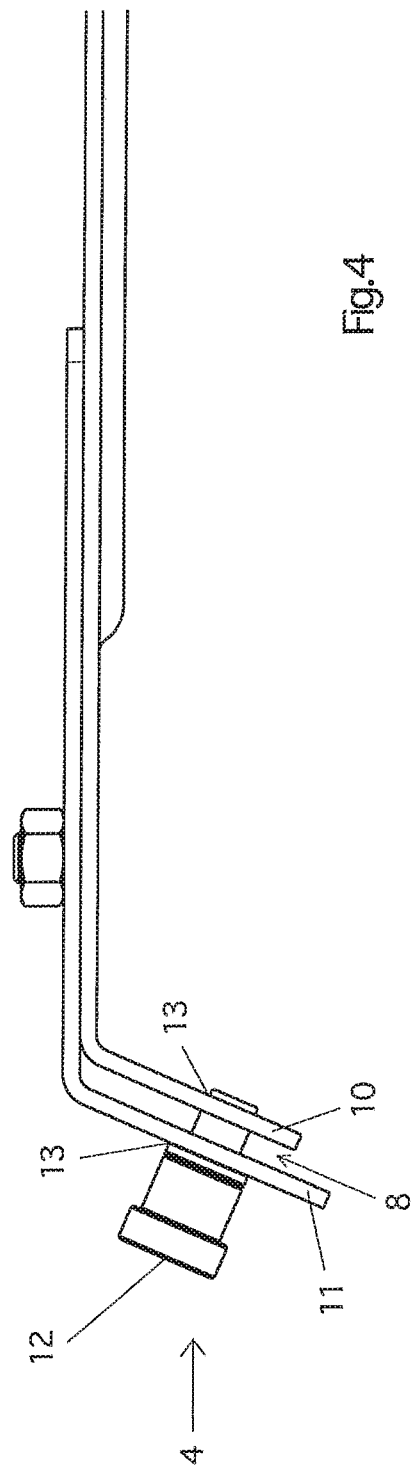

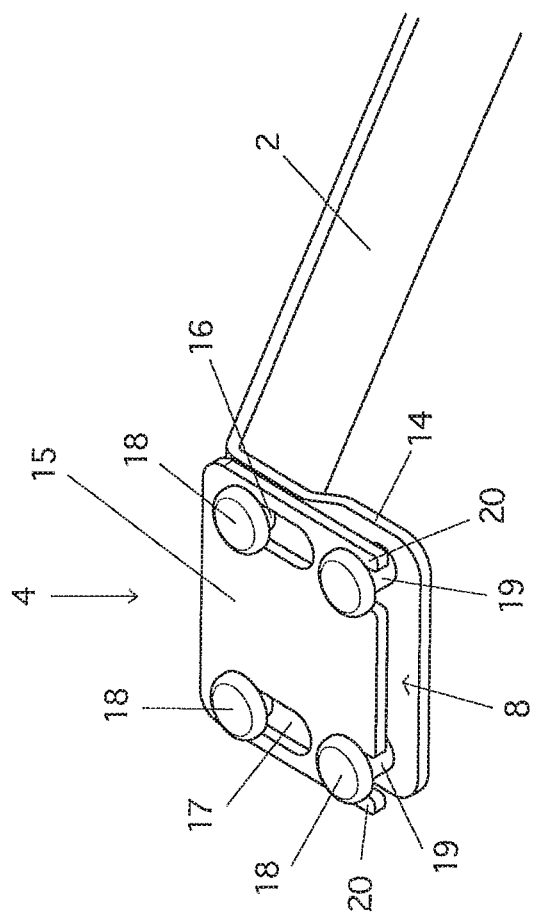

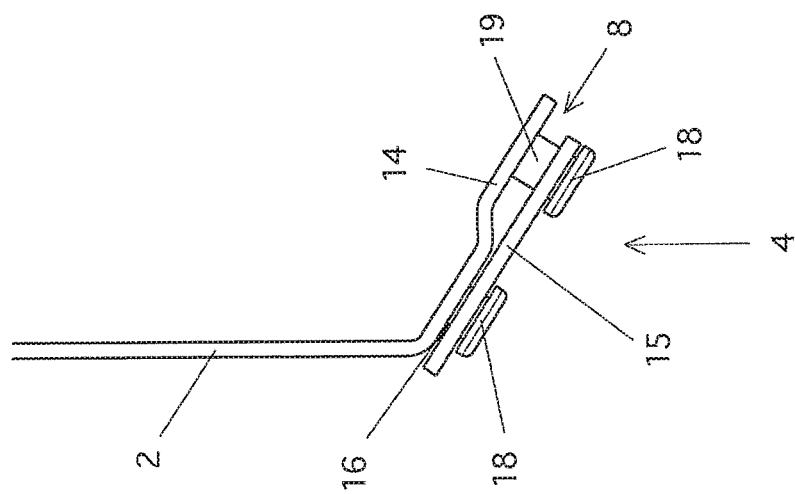

MOUNTING AID

CROSS-REFERENCE TO RELATED APPLICATIONS

This is the U.S. National Stage of PCT/AT2017/000057, filed Aug. 10, 2017, which claims priority to AT A 391/2016, filed Aug. 23, 2016, and all contents of each of these applications are incorporated herein by reference in their entireties.

The invention relates to a mounting aid for the mounting rack mounts in frames, in particular racks for use in information technology.

The invention further relates to the use of such a mounting aid.

By the term rack, in the context of the present invention and in accordance with the technical language, a rack for electrical appliances having a standard width of e.g. 19 inches is understood, where the individual devices, i.e. the rack mounts which can be mounted in the rack, have a width corresponding to the standardized width of e.g. 19 inches. In height direction, a rack is divided into standardized height units, which defines the minimum height of a rack mount, which is to be mounted. Rack mounts accordingly have a standardized height of one height unit or a multiple thereof. One height unit (HU) of a standard 19 inch rack has a height of 1.75 inches.

The rack mounts are fastened with their laterally projecting front plate on the rows of holes (square or round holes) of sheet metal angles extending vertically at the front side of the frame. The front plate is provided in its laterally projecting areas with holes, which serve receive connecting means, in particular bolts, when in a position aligned with the row of holes of the sheet metal angle. The sheet metal angles can be about 2 mm thick and, in the case of standardized 19 inch racks, each be 15.88 mm wide and form an approximately 19 inches wide opening in between. There are three holes one above the other per unit of height at intervals of 0.655 inches each.

The mounting of rack mounts in frames is complex and usually difficult, since the rack mounts have a certain weight and a certain bulkiness. The mounting of rack mounts usually takes place at the front side of the frame, i.e. where the vertically extending sheet metal angles provided with the row of holes are arranged. Since frames of the conventional type do not provide a support surface for placing the rack mounts, the installer must manually move the rack mount into a position in which the holes on the laterally projecting portions of the front plates are aligned with the holes of the row of holes of the sheet metal angles, hold the rack mount in this position and install the connecting screws. In doing this, the installer must either hold the rack mount himself in the correct position, so that only one free hand is available for fastening the rack mount, or the mounting must be carried out by two persons, wherein one of the involved persons must hold the rack mount in the correct mounting position and the other person must do the mounting in parallel.

Alternatively, the mounting of rack mounts can also take place on the back side of the frame, which is also provided with a row of holes.

Due to the above-mentioned shortcomings, the mounting of rack mounts is time-consuming and associated with high personnel expenses.

The present invention therefore aims to provide a mounting aid with which the aforementioned disadvantages can be overcome.

To solve this problem, the invention provides a mounting aid which comprises at least two relatively to one another adjustable, in particular pivotable legs, wherein the legs at their free ends each comprises a fastening element that is arranged in an angled manner with respect to the leg and is designed for fastening the free ends of the legs to rails, in particular sheet metal angles, of the frame, said rails being directed to each other, projecting inwardly and being provided with a row of holes. The mounting aid according to the invention allows a tool-free, rapid installation of rack mounts in frames, which may be accomplished by a single person without considerable effort and in a time-saving manner.

Before mounting, the mounting aid will be inserted into the rack from the front at the desired position, i.e. immediately below the desired mounting height of the rack mount. Subsequently, the legs are pivoted relative to one another until the fastening elements that are arranged in an angled manner at the end of the legs come to rest on the rails, in particular sheet metal angles, of the rack and can then be fixed there. The upper edge of the legs thus forms a bearing surface for the rack mount to be installed. During mounting the rack mount can be deposited on the upper edge of the legs, so that the installer no longer has to hold the rack mount for the attachment to the rails, in particular to the sheet metal angles.

The mounting aid is preferably held in the mounted state only with said fastening elements on the frame, wherein the legs, starting from the rails or sheet metal angles, are extending in a backward direction into the interior of the frame and have no further support in the area projecting into the interior. In order to form the mounting aid as torsionally rigid as possible, it is preferably provided that the legs are formed as flat, plate-shaped legs. The plate-shaped legs preferably have a longitudinally extending reinforcing rib, whereby the flexural rigidity is increased.

However, the invention is not only suitable as a mounting aid for the mounting into frames that are provided with sheet metal angles. Alternatively, for example, the mounting of rack mounts that are provided with row of holes rails or metal profiles would be imaginable. Such sheet metal profiles may e.g. be plastered into the wall and must therefore not be formed in an angular manner.

Preferably, the mounting aid is designed such that the legs are pivotable between a storage position abutting against each other and a V-shaped unfolded mounting position.

The storage position with abutting legs, i.e. that position in which the two legs lie flat against one another, enables a space-saving storage of the mounting aid in e.g. a toolbox. In turn, in the V-shaped unfolded mounting position, the mounting, aid spans a triangle, which ensures a stable support of the rack mount.

Furthermore, it is preferably provided that the angled fastening element has a gap, in which the rail of the frame provided with the row of holes is receivable. The weight of the legs exerts a tilting moment on the fastening elements, which leads, when suitably designed, to a wedging of the fastening elements on the rails that are each received in the rap of the fastening elements and to a self-locking, so that the mounting aid holds on the rails without further connecting elements. This effect is further enhanced when a rack mount is deposited thereon.

Particularly preferably, the gap is formed by two parallel plates, so that the rails, in particular sheet metal angles, of the rack are received between the two plates. The design with two plates delimiting the gap allows additional attachment of the fastening elements to the rails or sheet metal angles. According to a first preferred embodiment, it is provided for this purpose that the plates are held at an adjustable distance from each other and are capable of being clamped together with the aid of clamping means while clamping the rail or the sheet metal angle, respectively. The adjustable distance of the plates allows a simple adaptation of the gap width to the manufacturer-dependent varying thickness of the rails, in particular sheet metal angles.

The adjustable distance also facilitates the clamping together of the plates while clamping the rails. When placing the mounting element in the rack, a slightly wider distance between the two plates is advantageous. As soon as the mounting element is already in the correct position it is fixed, which in the aforementioned case is achieved by means of clamping means, which reduce the distance between the plates and thus cause clamping of the sheet metal angle.

In a particularly preferred manner the clamping means are screws.

According to an alternative embodiment, it is preferably provided that a first of the two plates is rigidly connected to the respective leg and carries at least one, preferably two, connecting element (s) being able to be put, through a hole of the row of holes; and that a second of the two plates is arranged to be insertable so as to be engaged from behind by the connecting element.

The connecting elements arranged on the first plate are inserted at the desired height from the rear or front side through the respective holes of the rail or the sheet metal angle of the rack. To fix the mounting aid, the second plate is positioned on the other side, i.e. while receiving the rail or the sheet metal angle between the two plates, such that the connecting elements engage the second plate from behind, whereby the connecting elements are secured against protruding from the respective hole and the fastening elements are thereby fixed relative to the rail or sheet metal angle. For this purpose, the connecting elements preferably have a projection, such as, e.g., a thickened end, which engages the edge of an opening formed in the second plate from behind.

Particularly preferably, the second plate is slidably guided relative to the first plate, preferably on the first plate, so that the second plate can be moved in a simple manner in a position, in which the connecting elements engage the second plate from behind. The relative movability of the second plate is preferably achieved in a structurally particularly simple manner in that pins or bolts arranged on one of the plates are slidably held in longitudinal holes that are formed on the other plate.

Preferably, the second plate has at least one slot open towards the edge of the plate, the edges of the slot being engaged from behind by a widened end of the connecting element, in particular pin, when the second plate is positioned to be displaced towards the row of holes.

A preferred embodiment of the invention provides that the legs are pivotable relative to each other about a pivot axis extending parallel to the longitudinal extension of the rails, in particular sheet metal angles.

Furthermore, it is preferably provided that the legs are connected directly to each other by a hinge comprising the pivot axis, so that the legs form a. V-shape in the unfolded mounting position.

Alternatively, a preferred embodiment of the invention provides that the mounting aid comprises three legs pivotable relative to one another, wherein only the outer two of the legs each have a fastening element at their free ends, wherein the three legs are arranged to be swung open in a trough-shaped manner.

A trough-shaped span of the mounting aid requires—just like a V-shaped clamping span—an effective and stable variant to support the rack mount to be installed.

A further preferred embodiment provides that the fastening elements on the legs of the mounting aid are braceable outwardly against the rails, in particular sheet metal angles, of the frame, whereby a holding force is exerted that allows for an attachment of the mounting aid also without additional connecting means, such as screws. For bracing, for example, a further leg or a spacer may be provided, which extends from one fastening element to the other fastening element and is positioned or clamped with prestress between the two fastening elements in order to press the fastening elements against the rails of the frame. The further leg may preferably be pivotally attached to one of the two legs.

Alternatively, the legs of the mounting aid would also be designable in one piece and made of spring steel, wherein the fastening elements are located at the two ends of the spring steel strip. Since spring steel requires some flexibility, in this embodiment, no separate joint is needed, since the adjustment, namely the bending of the spring steel strip causes a semi-circular shape of the mounting aid, whereby a similar support surface is provided for the rack mount as in a design with two legs being pivotable to assume a V-shape.

Figure 2:
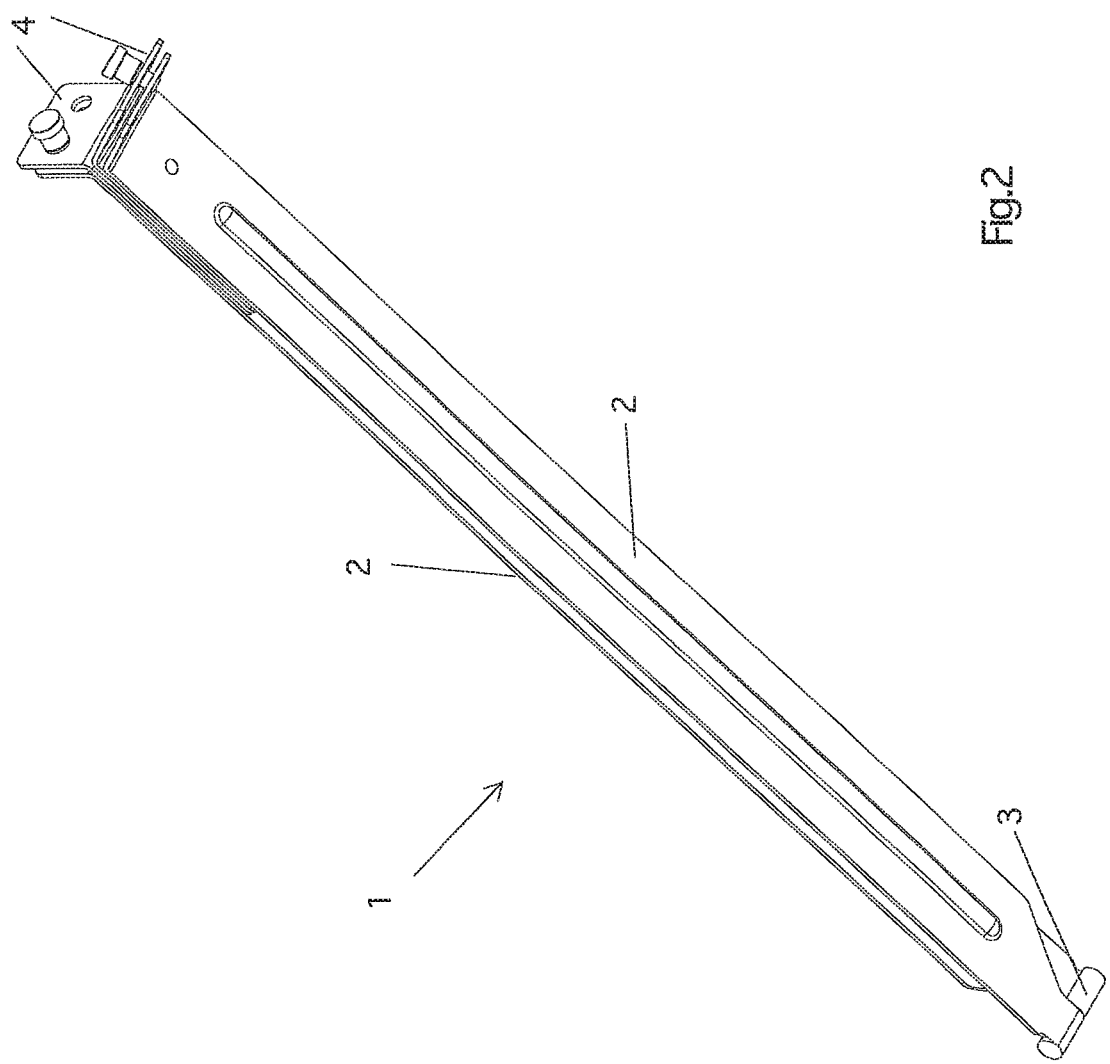
Figure 3:
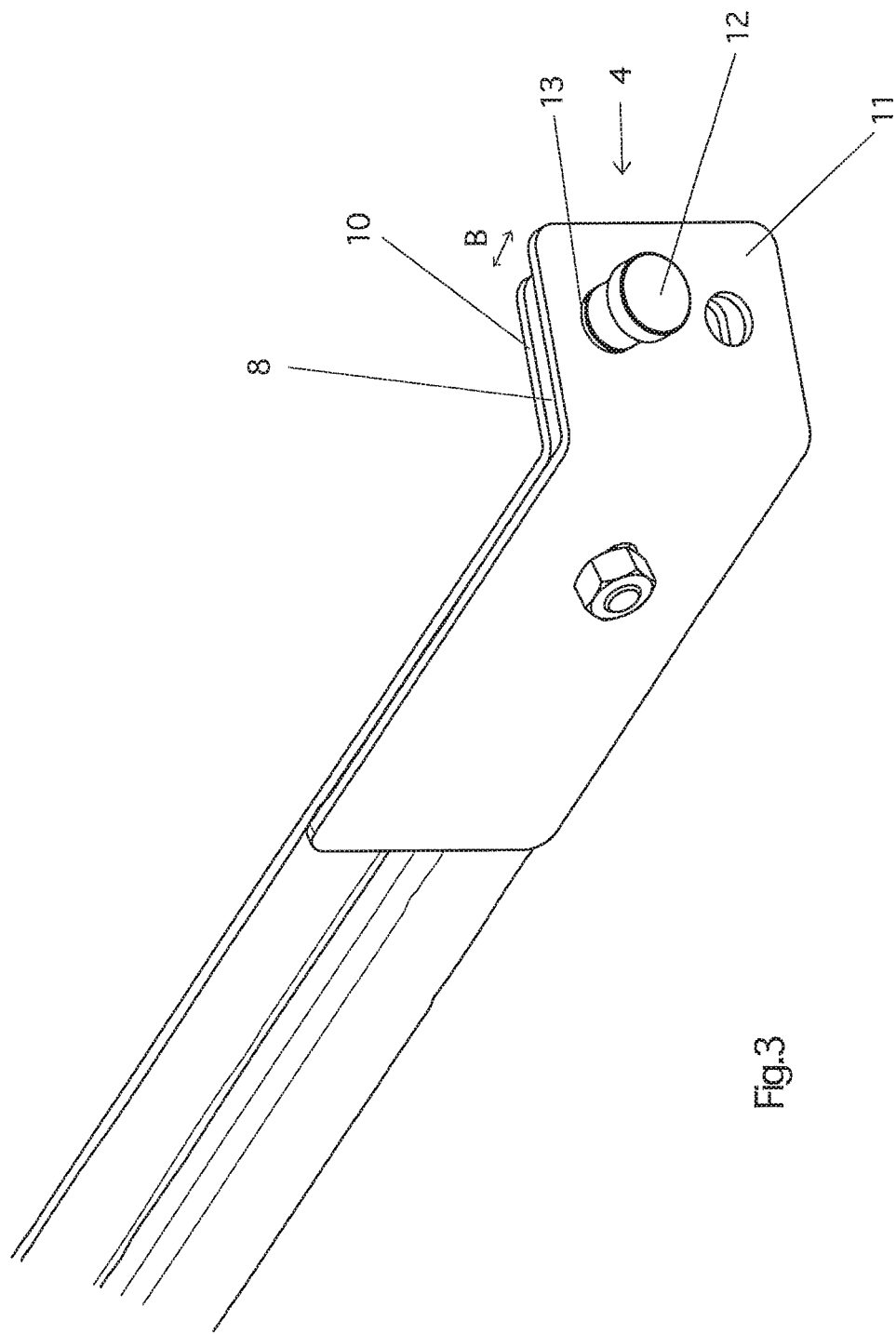

The invention will be explained in more detail with reference to embodiments shown schematically in the drawing. Therein, FIG. 1 shows a perspective view of an embodiment of the mounting aid according to the invention in a mounting position, FIG. 2 shows a perspective view of the embodiment shown in FIG. 1 in the storage position, FIG. 3 shows a perspective detail view of a first embodiment of the angled fastening element, FIG. 4 is a top view of the first embodiment of the angled fastening element shown in FIG. 3, FIG. 5 is a detailed perspective view of a second embodiment of the angled fastening element, and FIG. 6 is a top view of the second embodiment of the angled fastening element shown in FIG. 5.

In FIG. 1, a mounting aid is designated with 1. The mounting aid 1 comprises two relatively pivotable legs 2, which are connected directly to each other by a hinge 3 exhibiting by a pivot axis A. At their free ends the legs 2 comprise a fastening element 4 that is angled relative to the leg 2, wherein the legs 2 are fixed to sheet metal angles 5 of the frame, said sheet metal angles 5 being directed to each other, projecting inwardly and being provided with a row of holes.

FIG. 1 shows the mounting aid 1 in the mounting position being folded apart about the pivot axis A of the hinge 3 to assume a V-shape. In this position, the upper edge 6 of the legs 2 forms a bearing surface for a rack mount to be installed (not shown in FIG. 1). Furthermore, the legs 2 have longitudinally extending reinforcing ribs 7 in order to increase the flexural rigidity of the legs 2.

For fastening the mounting aid 1 to the sheet metal angles 5 of the frame, the sheet metal angles 5 are each received in an outwardly open gap 8 of the fastening elements 4.

As can be seen from FIG. 1, the sheet metal angle 5 of the frame is provided with a row of holes.

In the state not fastened to the sheet metal angles 5 of the frame, the mounting aid 1 can be folded or unfolded about the pivot axis A in accordance with arrow 9.

FIG. 2 shows a perspective view of the mounting element 1 shown in FIG. 1 in the folded storage position. The legs 2 are abutting flat against each other and are not folded apart. Only the angled fastening element 4 at the end of the legs 2 are protruding.

In FIG. 3 it is shown that the gap 8 formed in the fastening element 4 is formed by two parallel plates 10, 11. The plates 10, 11 are held at an adjustable distance B from each other and are capable of being clamped together or adjusted with the aid of a clamping means 12 under clamping of the sheet metal angle 5 not shown in FIG. 3.

The fastening element 4 engages the sheet metal angle 5 of the frame, wherein the gap 8 receives the sheet metal angle 5. In order to fix the mounting element 1 in the correct position, the gap 8 is placed so as to enclose the sheet metal angle 5, such that the holes located in the plates 10, 11 each cover the holes located in the perforated row of the sheet metal angle 5. In order to reduce the distance between the plates 10, 11 and thereby clamp the sheet metal angle 5 between the plates 10, 11, the clamping means 12 is inserted through the hole 13 of the plate 11 and then screwed into a threaded hole 13 formed on the first plate 10 (FIG. 4).

FIG. 4 shows a top view of the first embodiment of the angled fastening element 4 illustrated in FIG. 3.

FIG. 5 shows a second embodiment of the angled fastening element 4. The first plate 14 delimiting the gap 8 is rigidly connected to the leg 2 and comprises four bolts 16 and 19. Two bolts 16 are guided in longitudinal holes 17 of the second plate 15 so that the second plate 15 is slidably guided relative to the first plate. The bolts 16 have thickened ends 18, which define the maximum distance between the two plates 14, 15 and the thickness of the gap 8, respectively. Two further bolts 19 also have thickened ends 18, which, in the displacement position of the second plate 15 shown in FIG. 5, engage edges of open slots 20 from behind. In order to fix the fastening element 4 to a sheet metal angle 5, the bolts 18 having been exposed by pushing away the second plate 15 are inserted through corresponding holes of the sheet metal angle 5, so that the thickened ends 18 of the bolts 19 project on the other side of the sheet metal angle 5. Thereafter, the second plate 15 is displaced relative to the first plate 14 until the slots 20 open towards the edge engage around the bolts 19, wherein the thickened ends 18 of the bolts 19 engage behind the edge of the respective slot 20, whereby the bolts 19 are secured against falling out of the holes of the sheet metal angles 5 and the fastening element 4 is fixed to the sheet metal angle 5.

FIG. 6 shows a top view of the second embodiment of the angled fastening element 4 shown in FIG. 5.

The invention claimed is:

1. Mounting aid for the mounting of rack mounts in frames for use in information technology, comprising at least two plate shaped legs that are relatively adjustable and pivotable to one another, wherein the at least two plate shaped legs at their free ends each comprises an angled fastening element that is arranged in an angled manner with respect to the leg and is designed for fastening the free end of each of the legs to rails of the frame, said rails being directed to each other, projecting inwardly and being provided with a row of holes, characterized in that, at ends that are opposite to their free ends, the at least two plate shaped legs are directly interconnected by a hinge comprising a pivot axis.

whereby the at least two plate shaped legs are pivotable between a storage position abutting against each other with side faces of the at least two plate shaped legs facing each other and a V-shaped unfolded mounting position, whereby an upper edge of each of the at least two plate shaped legs forms a bearing surface for the rack mount in the V-shaped unfolded mounting position.

2. The mounting aid according to claim 1, characterized in that each of the angled fastening elements has a gap in which the rails of the frame provided with the row of holes is receivable therein.

3. The mounting aid according to claim 1, characterized in that the legs are pivotable relative to one another about the pivot axis extending parallel to a longitudinal extension of the rails.

4. The mounting aid according to claim 2, characterized in that the gap is formed by two parallel plates.

5. The mounting aid according to claim 4, characterized in that the plates are held at an adjustable distance from each other and are capable of being clamped together via clamping means while clamping the rail in between.

6. The mounting aid according to claim 5, characterized in that the clamping means are screws.

7. The mounting aid according to claim 4, characterized in that a first plate of the two plates is rigidly connected to the respective leg and carries at least one connecting element configured to be put through a hole of the row of holes of the rail, and that a second plate of the two plates is arranged to be insertable so as to be engaged from behind by the connecting element.

8. The mounting aid according to claim 7, characterized in that the second plate is slidably guided relative to and on the first plate.

9. The mounting aid according to claim 7, characterized in that the second plate has at least one slot open towards an edge thereof, and wherein edges of the slot are configured to be engaged from behind by a widened end of the connecting element when the second plate is positioned to be displaced towards the row of holes.

10. The mounting aid according to claim 1, wherein the rails of the frame are provided in the form of sheet metal angles.

11. The mounting aid according to claim 1, wherein each of the at least two plate shaped legs further comprise a longitudinally extending reinforcing rib in the side face thereof.

\* \* \* \* \*